(12) United States Patent
Zhou et al.

(10) Patent No.: US 12,255,055 B2
(45) Date of Patent: Mar. 18, 2025

(54) INTEGRATED CLEANING PROCESS FOR SUBSTRATE ETCHING

(71) Applicant: Applied Materials, Inc., Santa Clara, CA (US)

(72) Inventors: Yi Zhou, Fremont, CA (US); Seul Ki Ahn, San Jose, CA (US); Seung-Young Son, Santa Clara, CA (US); Li-Te Chang, Sunnyvale, CA (US); Sunil Srinivasan, Pleasanton, CA (US); Rajinder Dhindsa, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/052,542

(22) Filed: Nov. 3, 2022

(65) Prior Publication Data

US 2023/0086917 A1    Mar. 23, 2023

Related U.S. Application Data

(63) Continuation of application No. 16/224,699, filed on Dec. 18, 2018, now Pat. No. 11,521,838.

(51) Int. Cl.
*H01J 37/32* (2006.01)
*B08B 7/00* (2006.01)
(Continued)

(52) U.S. Cl.
CPC .......... *H01J 37/32862* (2013.01); *B08B 7/00* (2013.01); *C23C 16/4405* (2013.01);
(Continued)

(58) Field of Classification Search
CPC .......... H01J 37/32862; H01J 2237/334; H01J 2237/335; B08B 7/00; C23C 16/4405;
(Continued)

(56) References Cited

U.S. PATENT DOCUMENTS 5,681,424 A * 10/1997 Saito ................ H01L 21/02071
134/1.1
6,235,640 B1 * 5/2001 Ebel ................ H01L 21/76802
438/719
(Continued)

FOREIGN PATENT DOCUMENTS

CN          109427534 A       3/2019

OTHER PUBLICATIONS

CN-109427534-A, English Translation (Year: 2020).

*Primary Examiner* — Duy Vu N Deo
*Assistant Examiner* — Christopher Remavege
(74) *Attorney, Agent, or Firm* — Lowenstein Sandler LLP (57) ABSTRACT

A method for removing etchant byproduct from an etch reactor and discharging a substrate from an electrostatic chuck of the etch reactor is provided. One or more layers on a substrate electrostatically secured to an electrostatic chuck within a chamber of the etch reactor is etched using a first plasma, causing an etchant byproduct to be generated. A portion of the one or more layers are covered by a photoresist. After the etching is complete, a second plasma is provided into the chamber for a time period sufficient to trim the photoresist and remove a portion of the etchant byproduct. A second time period sufficient to electrostatically discharge the substrate using the second plasma is determined. Responsive to deactivating one or more chucking electrodes of the electrostatic chuck, the second plasma is provided into the chamber for the second time period and the substrate is removed from the chamber.

18 Claims, 9 Drawing Sheets

(51) Int. Cl.
*C23C 16/44* (2006.01)
*H01L 21/3065* (2006.01)
*H01L 21/67* (2006.01)
*H01L 21/683* (2006.01)

(52) U.S. Cl.
CPC .... *H01L 21/3065* (2013.01); *H01L 21/67063* (2013.01); *H01L 21/6831* (2013.01); *H01J 2237/334* (2013.01); *H01J 2237/335* (2013.01)

(58) Field of Classification Search
CPC ........... H01L 21/3065; H01L 21/67063; H01L 21/6831
See application file for complete search history.

(56) References Cited

U.S. PATENT DOCUMENTS

| | | | |
|---|---|---|---|
| 6,872,322 | B1 | 3/2005 | Chow et al. |
| 7,892,445 | B1 | 2/2011 | Wei et al. |
| 8,398,783 | B2 | 3/2013 | Lee et al. |
| 2003/0049876 | A1* | 3/2003 | Mori ................ H01L 21/28123 257/E21.256 |
| 2003/0236004 | A1* | 12/2003 | Sung .................... H01L 21/6833 438/795 |
| 2005/0066994 | A1 | 3/2005 | Biles et al. |
| 2006/0076313 | A1* | 4/2006 | Chou ................ H01L 21/32139 257/E21.582 |
| 2011/0056514 | A1 | 3/2011 | Lee et al. |
| 2012/0052690 | A1 | 3/2012 | Belostotskiy et al. |
| 2012/0094494 | A1* | 4/2012 | Chen ................ H01L 21/31144 438/711 |
| 2013/0014371 | A1 | 1/2013 | Povolny |
| 2013/0021717 | A1* | 1/2013 | Singh ................ H01L 21/6831 361/234 |
| 2013/0153147 | A1 | 6/2013 | Senzaki et al. |
| 2014/0057421 | A1 | 2/2014 | Oh et al. |
| 2015/0194330 | A1* | 7/2015 | Sasaki ................ H01L 21/68792 361/234 |
| 2015/0371882 | A1 | 12/2015 | Tsai et al. |
| 2016/0099187 | A1* | 4/2016 | Lian ........................ H01L 22/26 438/8 |
| 2017/0213723 | A1* | 7/2017 | Xiang ............... H01L 21/31144 |
| 2019/0074209 | A1 | 3/2019 | Sasaki et al. |
| 2019/0157052 | A1 | 5/2019 | Doan et al. |

* cited by examiner

| # | General | | RF Control | | Thermal Control | | | | | | Gas Control | | | | Gases |
|---|---------|------|------------|---------|------------------|------|------|------|------|---------|-------------|-------|-------|-------|-------|
|   | Step    | Time (sec) | Source RF Ws | Bias RF Wb | ESC Temperature (C) | | | | | P (mTorr) | TGD(%) | | | | O₂ |
|   |         |      | | | $T_C$ | $T_L$ | $T_{MI}$ | $T_{MO}$ | $T_O$ | | C | M | E | | |
| 01 | ST | 2-10 | 0 | 0 | 30-90 | 60-120 | 60-120 | 60-120 | 60-120 | 10-60 | 0-100 | 0-100 | 0-100 | 0 |
| ... | ... | ... | ... | ... | ... | ... | ... | ... | ... | ... | ... | ... | ... | ... |
| 76 | O₂ Flush | 5-20 | 1300-4500 | 0-50 | 30-90 | 60-120 | 60-120 | 60-120 | 60-120 | 10-60 | 0-100 | 0-100 | 0-100 | 500-3500 |
| 77 | Dechuck | 5-20 | 1300-4500 | 0-50 | 30-90 | 60-120 | 60-120 | 60-120 | 60-120 | 10-60 | 0-100 | 0-100 | 0-100 | 500-3500 |

INTEGRATED CLEANING PROCESS FOR SUBSTRATE ETCHING

RELATED APPLICATIONS

This patent application is a continuation application of U.S. patent application Ser. No. 16/224,699 filed on Dec. 18, 2018, which is incorporated by reference herein.

TECHNICAL FIELD

Embodiments of the present disclosure relate, in general, to the manufacture of substrates used as semiconductors, and, in particular to a dechuck process that also performs the function of an in-situ chamber cleaning process.

BACKGROUND

Various manufacturing processes are performed while a substrate is electrostatically secured to an electrostatic chuck (ESC) for the duration of a processing period. The manufacturing processes may involve chemical reactions that cause byproducts to form within the manufacturing environment. After the completion of the processing period, the substrate may be removed from the ESC using a conductive plasma to discharge the electrostatic force securing the substrate to the ESC. Subsequently, another plasma process is then performed with no substrate secured on the ESC to remove the byproducts formed during the processing period from the manufacturing environment, commonly referred to as in-situ chamber cleaning (ICC). The ICC process performed after a substrate is removed from the process chamber adds additional process time for a manufacturing process and erodes components within the manufacturing environment, including the ESC.

SUMMARY

Some of the embodiments described herein cover a method including electrostatically securing a first substrate to an electrostatic chuck (ESC) within a chamber of an etch reactor. The substrate includes one or more layers, where each layer is composed of a non-metal material. A first plasma is provided into the chamber to etch one or more layers on the substrate. An etchant byproduct is generated as a result of etching the substrate layers. After the etching is complete, a second plasma is provided into the chamber, where the second plasma is an oxygen containing plasma. The etchant byproduct is removed from the chamber, and the first substrate is discharged from the ESC using the second plasma. The first substrate is removed from the chamber and a second substrate is inserted into the chamber without performing an in-situ chamber cleaning (ICC) between the removal of the first substrate and the insertion of the second substrate.

In some embodiments, a method includes electrostatically securing a first substrate to an ESC within a chamber of an etch reactor. The substrate includes one or more layers, where each layer is composed of a non-metal material. A first plasma is provided into the chamber to etch one or more layers on the substrate. An etchant byproduct is generated as a result of etching the substrate. After the etching is complete, a second plasma is provided into the chamber, where the second plasma is an oxygen containing plasma. The etchant byproduct is removed from the chamber using the second plasma. A third plasma is provided into the chamber, where the third plasma is an inert, non-oxygen containing plasma. The first substrate is discharged using the third plasma to release the first substrate from the ESC and is removed from the chamber. A second substrate is inserted into the chamber without first performing an ICC between removal of the first substrate from the chamber and insertion of the second substrate.

In some embodiments, a method includes electrostatically securing a first substrate to an ESC within a chamber of an etch reactor. The first substrate includes one or more layers, where each layer is composed of a non-metal material. A first plasma is provided into the chamber to etch the layers on the substrate. An etchant byproduct generates as a result of etching the substrate. After the etching is complete, a second plasma is provided into the chamber where the second plasma is an oxygen containing plasma. A first portion of the etchant byproduct is removed from the chamber using the second plasma for a first time period while the first substrate remains electrostatically secured to the ESC. The first substrate is discharged using the second plasma to release the first substrate from the ESC. A second portion of the etchant byproduct is removed from the chamber using the second plasma for a second time period during discharging. The first substrate is removed from the chamber and a second substrate is inserted into the chamber without first performing an in-situ chamber cleaning between removal of the first substrate from the chamber and insertion of the second substrate.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to have the same embodiment, and such references mean at least one.

DETAILED DESCRIPTION OF EMBODIMENTS

In the manufacture of integrated circuits, materials such as silicon dioxide, silicon nitride, polysilicon, and single crystal silicon are deposited or otherwise formed on a substrate and are etched in predefined patterns to form gates, vias, contact holes, trenches, and/or interconnect lines. Layers of these materials may then be etched using a plasma etch process. During the etching process, a patterned photoresist (also referred to as a mask) may be formed on the substrate to cover portions of the substrate. The exposed portions of the underlying material that lie between the features of the patterned mask may be etched by capacitive or inductively coupled plasmas of etchant gas.

During the etching process, etchant residue (often referred to as "debris") deposits on the walls and other component surfaces inside the etching chamber. The composition of the etchant residue depends upon the chemical composition of vaporized species of etchant gas, the material being etched, and the photoresist on the substrate. For example, when oxide, nitride or other oxygen or nitrogen-containing layers are etched, oxygen or nitrogen containing gaseous species are vaporized or sputtered from the substrate onto the surfaces inside the etching chamber. In addition, the photoresist on the substrate is also vaporized by the etchant gas to form gaseous hydrocarbon, fluorocarbon, chlorocarbon, or oxygen-containing species. The vaporized and gaseous species condense to form etchant residue comprising polymeric byproducts (also referred to herein as etchant byproducts) composed of highly fluorinated and/or chlorinate hydrocarbons. The polymeric byproducts deposit as thin layers of etchant residue on the walls and components in the chamber. The composition of the etchant residue varies considerably across the chamber surface depending on the composition of the localized gaseous environment, the location of the gas inlet and exhaust ports, and the geometry of the chamber. The etchant byproduct formed on the etching chamber surfaces is periodically cleaned to prevent contamination of the substrate. Typically, after processing each wafer, an in-situ "dry clean" chamber cleaning (ICC) process is performed in an empty etching chamber after a processed substrate has been removed to clean the chamber. Performing such ICC processes between wafer plasma etch processes can significantly increase the processing time associated with processing a single wafer or batch of wafers using a plasma etch reactor.

The present disclosure eliminates an ICC process that is typically performed on an empty chamber between wafer etch cycles. In embodiments, after the etching process and while a substrate is secured to an ESC, an oxygen-containing gas is introduced into the chamber and energized to form an oxygen plasma. The oxygen plasma reacts with the etchant byproducts to completely remove the debris. In addition, the oxygen plasma serves to discharge the electrostatic force on the substrate to dechuck the substrate being electrostatically held on the ESC. Accordingly, a single plasma process may be performed to both dechuck a secured substrate and to remove byproducts from the chamber. By eliminating the ICC process typically performed each time after an etched wafer is removed from the chamber, overall substrate processing time decreases significantly. For example, total processing time may be reduced by approximately 13% or more in embodiments, resulting in approximately a 10-15% improvement (e.g., a 13% improvement for some processes) in throughput for an etch reactor. Additionally, replacing the standard ICC process with an integrated oxygen cleaning and dechuck process extends the lifetime of components within the chamber, such as the ESC, that would typically suffer from erosion during ICC. This is because the cleaning is performed while the substrate is still positioned on the ESC, which protects the ESC from erosion by the cleaning process.

It should be noted that in embodiments the oxygen plasma does not sufficiently remove etchant byproduct from a chamber if the substrate is composed of a metal material. When a substrate composed of a metal material is etched, the etchant byproduct will also contain that metal material. Oxygen plasma may soften the metal containing etchant byproduct, but will not completely remove the etchant byproduct. Accordingly, for processes that etch metal containing substrates an ICC step is still performed following the etching and dechucking steps.

Figure 1:
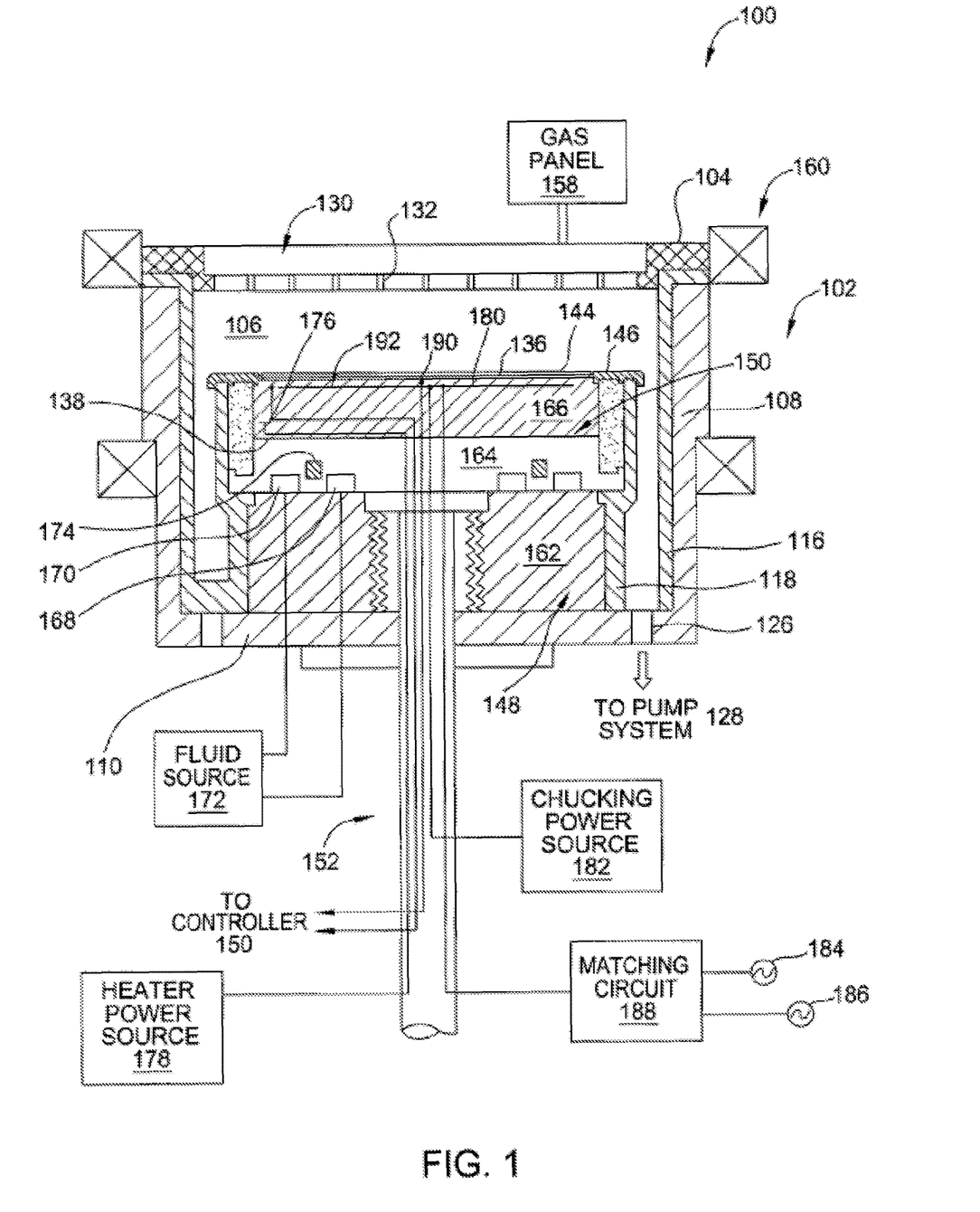
FIG. 1 illustrates a sectional view of a processing chamber.

FIG. 1 illustrates a sectional view of a semiconductor processing chamber 100, in accordance with embodiments. The processing chamber 100 may be used for processes in which a corrosive plasma environment is provided. For example, processing chamber 100 may be a chamber for a plasma etcher or plasma etch reactor, a plasma cleaner, plasma enhanced CVD or ALD reactors and so forth.

In one embodiment, processing chamber 100 includes a chamber body 102 and a showerhead 130 that enclose an interior volume 106. Showerhead 130 may include a showerhead base and a showerhead gas distribution plate. Alternatively, showerhead 130 may be replaced by a lid and a nozzle in some embodiments, or by multiple showerhead components and plasma generation units in other embodiments. Chamber body 102 generally includes sidewalls 108 and a bottom 110.

An outer liner 116 may be disposed adjacent to sidewalls 108 to protect chamber body 102. Outer liner 116 may be fabricated and/or coated with a bi-layer coating. In one embodiment, outer liner 116 is fabricated from aluminum oxide.

An exhaust port 126 may be defined in chamber body 102, and may couple interior volume 106 to a pump system 128. Pump system 128 may include one or more pumps and throttle valves utilized to evacuate and regulate the pressure of interior volume 106 of processing chamber 100.

Showerhead 130 may be supported on sidewall 108 of chamber body 102. Showerhead 130 (or lid) may be opened to allow access to interior volume 106 of processing chamber 100 and may provide a seal for processing chamber 100 while closed. A gas panel 158 may be coupled to processing chamber 100 to provide process and/or cleaning gases to interior volume 106 through showerhead 130 or lid and nozzle. Showerhead 130 may be used for processing chambers used for dielectric etch (etching of dielectric materials). Showerhead 130 includes a gas distribution plate 133 having multiple gas delivery holes 132 throughout the gas distribution plate 133. Showerhead 130 may include the gas distribution plate 133 bonded to an aluminum base or an anodized aluminum base. Gas distribution plate 133 may be made from Si or SiC, or may be a ceramic, such as $Y_2O_3$, $Al_2O_3$, $Y_3Al_5O_{12}$ (YAG), and so forth. Showerhead 130 and delivery holes 132 may be coated with a plasma resistant coating.

Examples of processing gases that may be used to process substrates in processing chamber 100 include halogen-containing gases, such as $CH_4$, $CHF_3$, and $CH_3F$, among others, and other gases such as $O_2$, or $N_2O$. Examples of carrier gases include $N_2$, He, Ar, and other gases inert to process gases (e.g., reactive gases). The substrate support assembly 148 is disposed in the interior volume 106 of processing chamber 100 below showerhead 130 or lid. Substrate support assembly 148 holds substrate 144 during processing. A ring 146 (e.g., a single ring) may cover a portion of electrostatic chuck 150, and may protect the covered portion from exposure during plasma processing. Ring 146 may be silicon or quartz in one embodiment.

An inner liner 118 may be coated on the periphery of substrate support assembly 148. Inner liner 118 may be a halogen-containing gas resist material such as those discussed with reference to outer liner 116. In one embodiment, inner liner 118 may be fabricated from the same materials of outer liner 116.

In one embodiment, substrate support assembly 148 includes a mounting plate 162 supporting a pedestal 152, and an electrostatic chuck (ESC) 150. ESC 150 further includes a thermally conductive base 164 and an electrostatic puck 166 bonded to the thermally conductive base by a bond 138, which may be a silicon bond, in one embodiment. Mounting plate 162 is coupled to the bottom of 110 of chamber body 102 and includes passages for routing utilities (e.g., fluids, power lines, sensor leads, etc.) to the thermally conductive base 164 and electrostatic puck 166.

Thermally conductive base 164 and/or electrostatic puck 166 may include one or more optional embedded heating elements 176, embedded thermal isolators 174 and/or conduits 168, 170 to control a lateral temperature profile of the substrate support assembly 148. The conduits 168, 170 may be fluidly coupled to a fluid source 172 that circulates a temperature regulating fluid through the conduits 168, 170. The embedded isolator 174 may be disposed between the conduits 168, 170 in one embodiment. Heater 176 is regulated by a heater power source 178. The conduits 168, 170 and heater 176 may be utilized to control the temperature of the thermally conductive base 164. The conduits and heater heat and/or cool the electrostatic puck 166 and the thermally conductive base 164 may be monitored using a plurality of temperature sensors 190, 192, which may be monitored using a controller 195.

The electrostatic puck 166 may further include multiple gas passages such as grooves, mesas, and other surface features that may be formed in an upper surface of the puck 166. The gas passages may be fluidly coupled to a source of a heat transfer (or backside) gas, such as He, via holes drilled in the electrostatic puck 166. In operation, the backside gas may be provided at controlled pressure into the gas passages to enhance the heat transfer between the electrostatic puck 166 and the substrate 144.

The electrostatic puck 166 includes at least one clamping electrode 180 controlled by a chucking power source 182. The clamping electrode 180 (or other electrode disposed in the electrostatic puck 166 or base 164) may further be coupled to one or more RF power sources 184, 186 through a matching circuit 188 for maintaining a plasma formed from process and/or other gases within the processing chamber 100. RF power sources 184, 186 are generally capable of producing RF signals having a frequency from about 50 kHz to about 3 GHz and a power of up to about 10,000 Watts.

During substrate processing, the substrate may be electrostatically secured to ESC 150 (also referred to as chucking). The electrodes disposed in electrostatic puck 166 or base 164 (e.g., clamping electrode 180) may generate an electrostatic force between the substrate and ESC 150, so as to prevent the substrate from shifting during processing. After substrate processing has completed, the substrate may be removed from ESC 150 (also referred to as dechucking) so as to allow for a new substrate to be processed. A plasma may be provided into the chamber to discharge any residual electrostatic force left on the substrate and release the substrate from the ESC 150 as part of a dechuck process. The plasma may be an oxygen containing plasma, or an inert, non-oxygen containing plasma, such as Ar, in embodiments. In embodiments, a combined dechuck and in-situ chamber cleaning (ICC) process is performed using an oxygen-based plasma after an etch process is complete. The combined dechuck and ICC process using the oxygen-based plasma may clean the chamber while also discharging the substrate 144 and releasing the substrate from the ESC 150. Since the combined dechuck and ICC process are performed while the substrate 144 is on the ESC 150, the ESC 150 is protected from the plasma used to perform the cleaning, which increases the life of the ESC 150 and reduces the number of replacement ESCs that are used during the lifetime of the chamber 100.

Figure 2A:
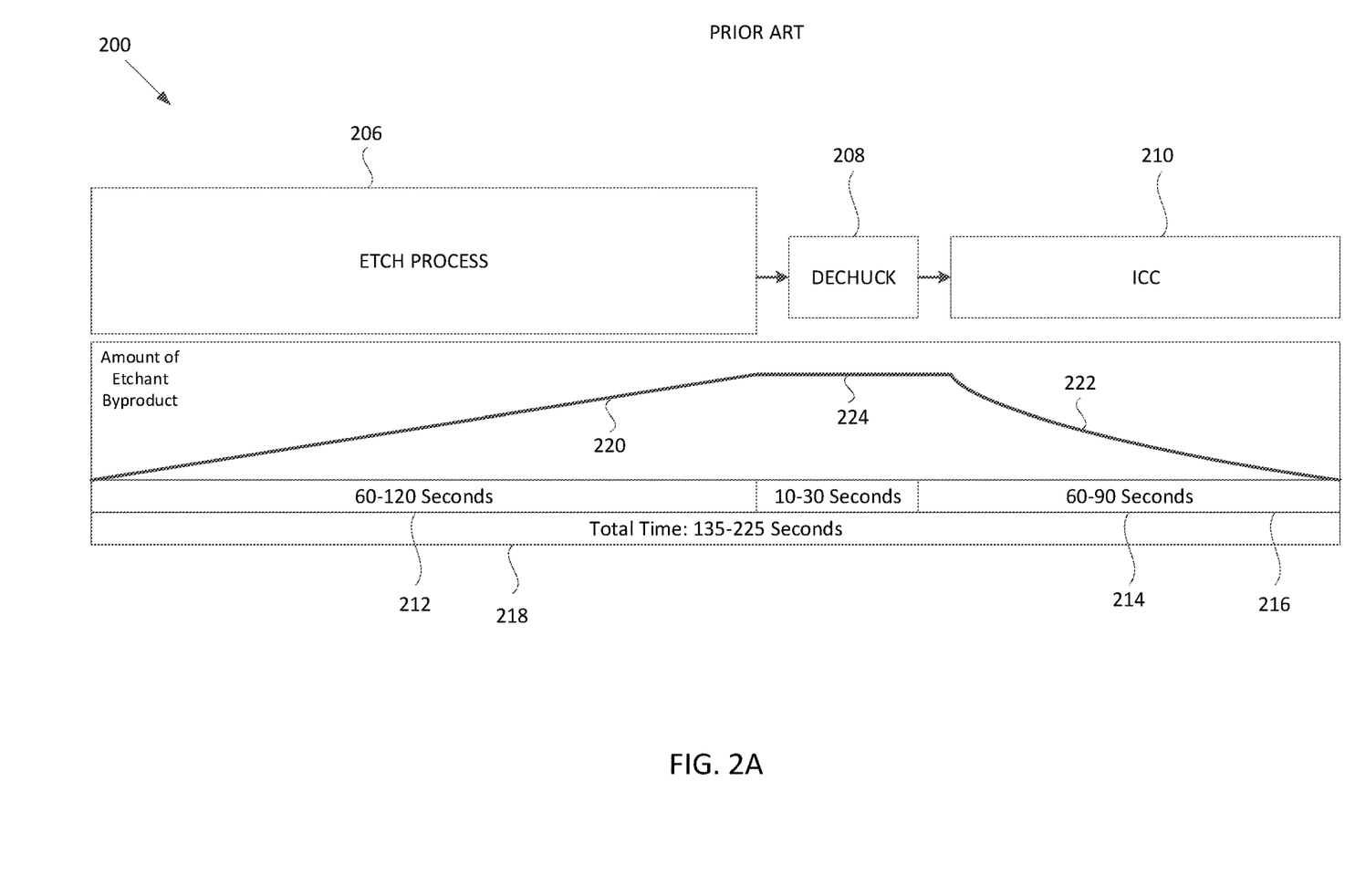
FIG. 2A illustrates an example time line of a traditional substrate etching process, which includes an in-situ chamber cleaning (ICC).

FIG. 2A illustrates an example time line of a traditional substrate etching process sequence 200, which includes performance of a traditional ICC process after a substrate has been removed from a process chamber. Traditional etching process sequence 200 may include an etch process 206, a dechuck step 208, and an in-situ chamber cleaning (ICC) step 210 after a substrate has been removed from the chamber.

During etch process 206, an etchant byproduct may be generated as a result of a reaction between the substrate and plasma used to etch the substrate, also referred to as an etchant plasma. The etchant byproduct may be deposited on the walls and other component surfaces within the chamber of the etch reactor. The amount of etchant byproduct may continue to accumulate during etch process 206, as illustrated by line 220.

Traditional etching process sequence 200 may include dechuck step 208 after the completion of etch process 206. During dechuck step 208, the etched substrate may be discharged from an ESC securing the substrate in place during etch process. The ESC may include a plurality of electrodes disposed throughout the ESC's surface controlled by a power source. The electrodes may establish an electrostatic holding force (e.g., an electrostatic force) between the ESC and the substrate (also referred to as "chucking" the substrate).

A dechuck plasma may be introduced to the chamber of the etch reactor to dechuck (or discharge) the substrate during dechuck step 208. The dechuck plasma may be provided into the chamber of the etch reactor to act as a conductive path for the charge on the wafer to discharge to the wall of the chamber. The dechuck plasma may be composed of an inert gas, such as Ar. During dechuck step 208, the amount of etchant byproduct in the chamber will not decrease following the etch process 206, as illustrated by line 224. After the substrate is discharged from the ESC, the substrate may be removed from the chamber. Dechuck step 208 may have a duration of between about 10 seconds to about 30 seconds.

Traditional substrate etching processes also include an ICC step 210 after the substrate is removed from the chamber. An ICC plasma may be provided into the chamber of the etch reactor to remove the etchant byproduct from the chamber. The ICC plasma generally includes $SF_6$, $NF_3$, $CF_4$, $H_2$, or $NH_3$. The ICC plasma may clean the interior of the chamber to prevent etchant byproduct accumulation and/or contamination of substrates used in future etching processes. ICC step 210 may have a duration of between about 60 seconds to about 90 seconds. The amount of etchant byproduct within the chamber will decrease during ICC step 210. The amount of etchant byproduct in the chamber may be measured by monitoring the optical emission of the etchant byproduct. When the optical emission signal from the etchant byproduct drops from a high intensity to a low intensity, as illustrated by line 222, the etchant byproduct may be completely removed and the chamber is cleaned.

As discussed previously, traditional etching process sequence 200 may include etch process 200 with a duration of about 60 seconds to about 120 seconds, dechuck step 208, with a duration of about 15 seconds, and ICC step 210 performed after a wafer is removed from the chamber, with a duration of about 60 seconds to about 90 seconds. The overall duration of a traditional etching process sequence 200 may be between about 135 seconds to about 225 seconds.

Figure 2B:
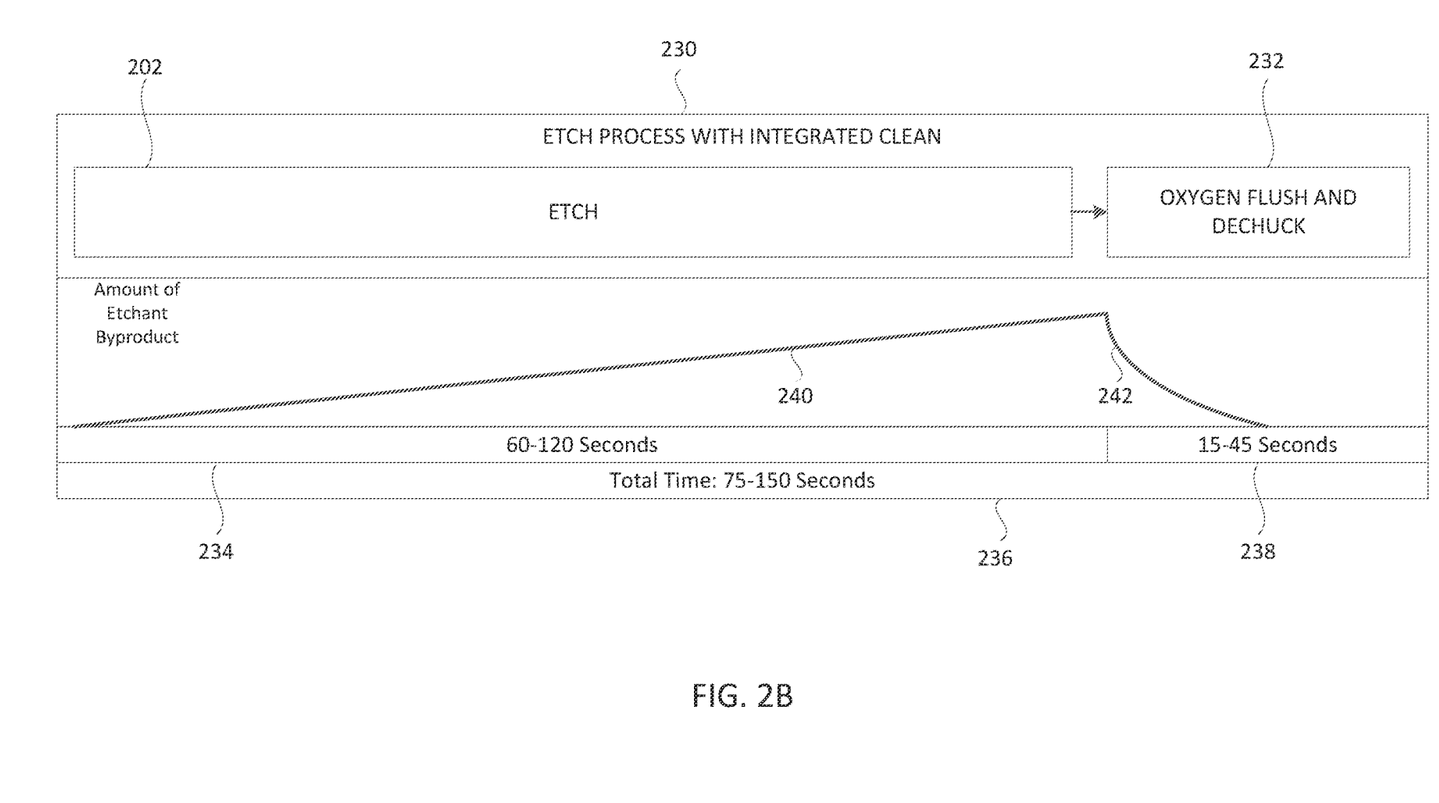
FIG. 2B illustrates an example time line of an etch process with integrated dechuck and clean steps, in accordance with embodiments described herein.

FIG. 2B illustrates example time line of an etch process 230 with integrated dechuck and clean steps, in accordance with embodiments described herein. Etch process 206, dechuck step 208, and ICC step 210 may be replaced with etch process 230 with integrated clean.

Etch process 230 may include etch step 202. During etch step 202, an etchant byproduct may be generated as a result of a reaction between the substrate and the etchant plasma. The etchant byproduct may be deposited on the walls and other component surfaces within the chamber of the etch reactor. The amount of etchant byproduct may continue to accumulate during etch step 202, as illustrated by line 240. Etch step 202 may have a duration of between about 60 seconds to about 120 seconds.

Etch process 230 may include an oxygen flush and dechuck step 232 in place of dechuck step 208 and ICC step 210 described with respect to FIG. 2A. In some embodiments, an oxygen containing plasma (also referred to as an oxygen-based plasma) is introduced into the chamber of the etch reactor during the oxygen flush and dechuck step 232. The oxygen-based plasma may act as a dechuck plasma and an etchant plasma, described with respect to FIG. 2A. The oxygen flush and dechuck step 232 may have a duration of between about 15 seconds to about 45 seconds. Etch process 230 with integrated clean may have an overall duration of between about 75 seconds to about 150 seconds. This is a significant decrease in overall process time compared to etching process sequence 200, which has an overall duration of between about 135 seconds to about 225 seconds.

Figure 2C:
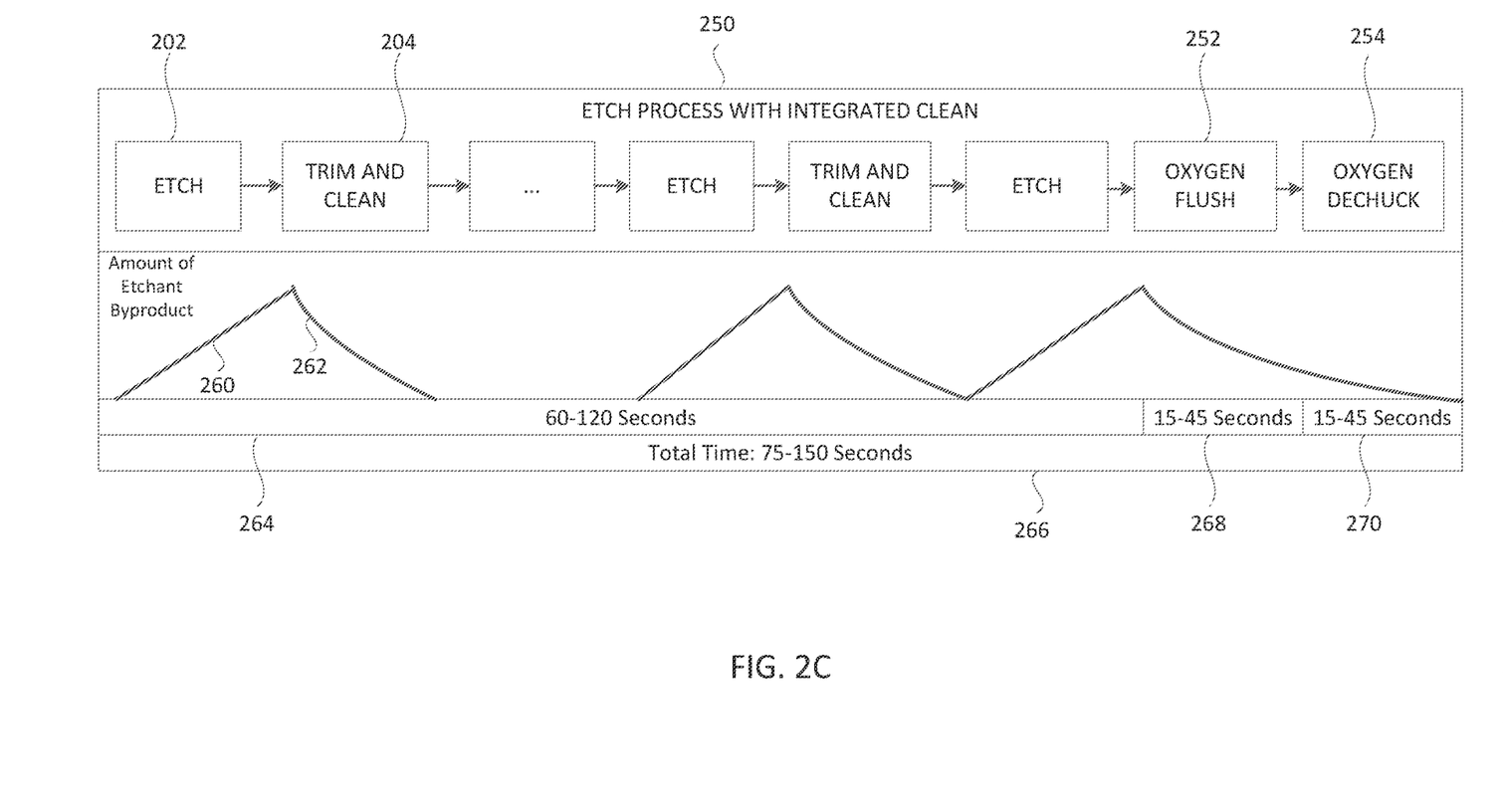
FIG. 2C illustrates another example time line of an etch process with integrated dechuck and clean steps, in accordance with embodiments herein.

FIG. 2C illustrates a detailed example time line of etch process 250 with integrated dechuck and clean steps, that are performed while a substrate is secured to an ESC, in accordance with embodiments described herein. Etch process 206, dechuck step 208, and ICC step 210 of etching process sequence 200, illustrated in FIG. 2A, may be replaced with etch process 250, which includes oxygen flush step 252 and oxygen dechuck step 254.

Etch step 202 may be performed to etch the substrate within the processing chamber, in accordance with embodiments described herein. In one embodiment, the substrate may include one or more layers of a non-metal material. The one or more layers may be composed of an oxide material and/or a nitride material. In one embodiment, the substrate may include a stack of a plurality of alternating oxide and nitride layers.

A photoresist may be disposed on a surface of the substrate. The photoresist may contain a detailed pattern that is to be etched on the surface of the substrate. During etch step 202, a first plasma may be introduced into the chamber of the etch reactor to etch portions of the substrate. In one embodiment, the first plasma may be composed of $CH_4$, $CHF_3$, $CH_3F$, or any plasma used to etch non-metal materials.

During etch step 202, an etchant byproduct may be generated as a result of a reaction between the substrate and the etchant plasma. The etchant byproduct may be deposited on the walls and other component surfaces within the chamber of the etch reactor. The etchant byproduct may be a polymeric byproduct composed of highly fluorinated hydrocarbons. The amount of etchant byproduct within the chamber may increase during etch step 202, as illustrated by line 260.

Following etch step 202, a second plasma may be introduced into the chamber of the etch reactor as part of a trim and clean step 204. The second plasma may be introduced to trim the photoresist disposed on the surface of the substrate. Trimming the photoresist may be performed to generate a new or different pattern of the photoresist, which then may be etched on the surface of the substrate during subsequent etch steps 202. The second plasma may be an oxygen based plasma (e.g., $O_2$, $O_3$, NO, $NO_2$, $NO_3$, etc.).

The second plasma may also remove a portion of the etchant byproduct from the chamber that resulted from etch step 202. As a result, the amount of etchant byproduct within the chamber may decrease. In one embodiment, the amount of etchant byproduct in the chamber may be measured by monitoring the optical emission of the etchant byproduct. When the optical emission signal from the etchant byproduct drops from a high intensity to a low intensity, as illustrated by line 262, the etchant byproduct may be completely removed and the chamber is cleaned. In some embodiments, all of the etchant byproduct may be removed from the chamber during the trim and clean step 204. In other embodiments, only a portion of the etchant byproduct may be removed during the trim and clean step 204.

Etch step 202 and trim and clean step 204 may be repeated until the substrate displays a target etched pattern. Etch process 206 may have a duration of about 60 seconds to about 120 seconds. In one embodiment, the duration of etch process 206 may depend on the target etched pattern of the substrate (e.g., the number of etch steps 202 and trim and clean steps 204 to be completed). Upon completion of etch process 206, the chamber of the etch reactor may contain etchant byproduct.

Etch process 230 may include an oxygen flush step 252 and oxygen dechuck step 254 that is performed after etch step 202 and trim and clean step 204 are complete. In one embodiment, oxygen flush step 252 and oxygen dechuck step 254 may be completed simultaneously, as illustrated with oxygen flush and dechuck step 232 of FIG. 2B. In another embodiment, illustrated in FIG. 2C, oxygen flush step 252 and oxygen dechuck step 254 may be completed as separate processes.

During oxygen flush step 252, an oxygen containing plasma may be provided for a duration of time sufficient to remove a first portion of the etchant byproduct form the etch reactor. The oxygen-based plasma may be composed of a plasma of $O_2$, $O_3$, NO, $NO_2$, $NO_3$, or a mixture thereof. In one embodiment, the oxygen plasma may be provided for a duration between about 5 seconds to about 45 seconds. The oxygen-based plasma may soften and remove a portion of the etchant byproduct that resides in the chamber of the etch reactor. In one embodiment, the oxygen-based plasma may not completely remove all etchant byproduct from the chamber.

During oxygen dechuck step 254, the same oxygen containing plasma may continue to be provided. However, a chucking electrode of the ESC may be activated during the oxygen flush step and may be deactivated during the oxygen dechuck step. Accordingly, the oxygen containing plasma discharges the substrate from the ESC securing the substrate in place during oxygen dechuck step 254. The oxygen-based plasma may be composed of a plasma of $O_2$, $O_3$, NO, $NO_2$, $NO_3$, or a mixture thereof.

The ESC may include a plurality of electrodes disposed throughout the ESC's surface controlled by a power source. The electrodes may establish an electrostatic holding force (e.g., an electrostatic force) between the ESC and the substrate. The oxygen-based plasma may act as a conductive path for the charge on the chucked substrate, thus allowing the substrate to be discharged. The oxygen-based plasma may also continue to soften and remove the etchant byproduct that resides in the chamber of the etch reactor that was not removed during oxygen flush step 252. The combined processing time of the oxygen flush step 252 and oxygen dechuck step 254 may be sufficient to completely remove any byproducts from the chamber. In some instances, the oxygen dechuck step alone is sufficient to completely remove all byproducts from the chamber. In some embodiments, the time at which the substrate fully discharges corresponds approximately to the time at which the last of the byproduct is removed from the chamber. Accordingly, oxygen flush step 252 and/or oxygen dechuck step 254 (which is a combined dechuck and ICC process) eliminates the traditional ICC step 210 shown in FIG. 2A.

The oxygen plasma of oxygen dechuck step 254 may be provided for a duration of time sufficient to discharge the substrate from the ESC. In one embodiment, the duration of time may be between about 15 seconds to about 45 seconds. In one embodiment, the duration of time may be between about 15 to about 30 seconds. Overall, the duration of time to complete etch process 250 may be between about 75 seconds to about 150 seconds.

Figure 3:
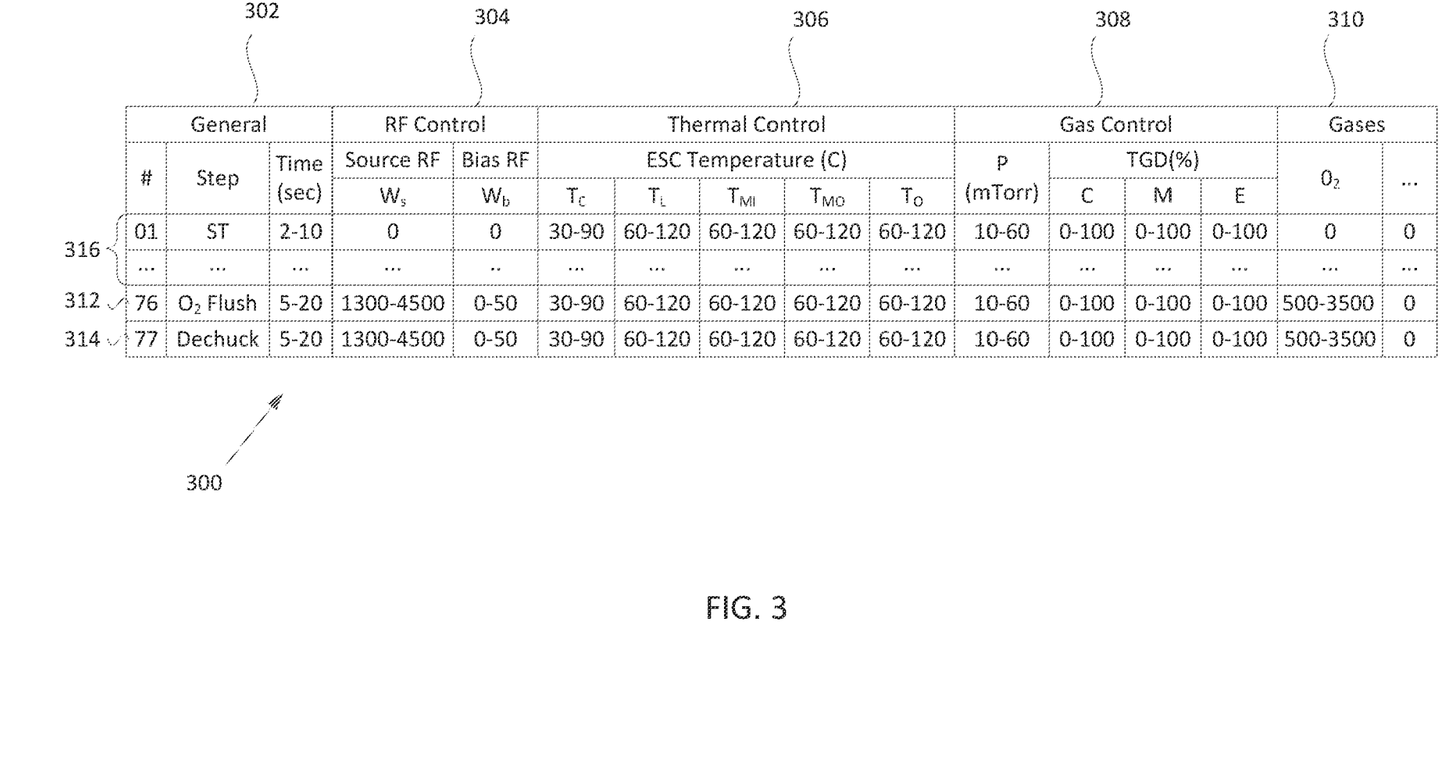
FIG. 3 illustrates a process recipe table for an etch process with integrated dechuck and clean steps, in accordance with embodiments described herein.

FIG. 3 illustrates a process recipe table 300 for an etch process with combined dechuck and clean steps. In one embodiment, process recipe table 300 may reference conditions and controls utilized in etch process 230 with integrated clean illustrated in FIG. 2C. Process recipe table 300 may reference various controls and conditions that may be manipulated to minimize the duration of time to complete oxygen flush and dechuck step 232 described with respect to FIG. 2B.

General section 302 of recipe table 300 may provide general information about each step being performed during the etch process. General section 302 may provide information regarding the type of action that is being performed during each step, the order in which each step of the etch process is performed, and the duration of time to perform each step. In one example steps 312 and 314 may correspond with oxygen flush and dechuck step 232 described with respect to FIG. 2B, or oxygen flush step 252 and oxygen dechuck step 254 described with respect to FIG. 2C. Steps 316 may correspond with steps outlined in a process of record (POR) associated with the etch process.

RF control section 304 may provide information regarding the source power and bias power for each step performed during the etch process. In one embodiment, oxygen flush step 312 and/or substrate dechuck step 314 may be performed with a source power of between about 1500 Watts (W) to about 4500 W. In one embodiment, oxygen flush step 312 and/or substrate dechuck step 314 may be performed with a source power of between about 2000 to about 3000 W. Oxygen flush step 312 and/or substrate dechuck step 314 should not be performed with a source power of below about 1500 W in one embodiment to ensure that the etchant byproduct within the chamber may be effectively removed during oxygen flush step 312 and the substrate may be adequately discharged from the ESC during substrate dechuck step 314. In one embodiment, oxygen flush step 312 and/or substrate dechuck step 314 may be performed with a bias power between about 0 W to about 50 W. In another embodiment, bias power may not be used to perform oxygen flush step 312 and/or substrate dechuck step 314. As such, oxygen flush step 312 and/or substrate dechuck step 314 may be performed with a bias power of about 0 W.

Thermal control section 306 may provide information regarding the temperature of various points of the ESC supporting the substrate during the etch process. For example, the temperatures of the cathode electrode displaced in the ESC (e.g., $T_C$), as well as various portions of the ESC surface, including the inner portion (e.g., $T_1$), the middle-inner portion (e.g., $T_{MI}$), the middle-outer portion (e.g., $T_{MO}$), and the outer portion (e.g., $T_O$), may differ during the etch process.

Gas control section 308 may provide information regarding the internal pressure of the chamber within the etch reactor. In one embodiment, the internal pressure of the chamber may be between about 10 mTorr and about 60 mTorr during oxygen flush step 312 and/or substrate dechuck step 314. In one embodiment, the internal pressure of the chamber may be between about 20 to about 500 mTorr during oxygen flush step 312 and/or substrate dechuck step 314.

Gas control section 308 may further provide information regarding the total gas distribution (TGD) from a gas source component (e.g., showerhead) of the etch reactor. Plasmas used to complete oxygen flush step 312 and substrate dechuck step 314 may be formed from gases introduced to the chamber of the etch reactor via a gas source component. The gas may be introduced from a center (C) portion, a middle (M) portion, or an edge (E) portion of the gas source component. The total gas distribution may be manipulated so that gas may be introduced into the chamber from C, M, and/or E portions of the gas source component during the etch process. The total gas distribution may be between 0-100% for each of the C, M, and/or E portions of the gas source component. In one embodiment, the total gas distribution may be essentially equal between the C, M, and E portions (e.g., 33% distribution to C portion, 33% distribution to M portion, and 34% distribution to E portion).

Gases section 310 may provide information regarding the flow rate of each gas utilized for each step of the etch process. In one embodiment, $O_2$ may be used as an oxygen source for oxygen flush step 312 and substrate dechuck step 314. $O_2$ may be the only gas provided to the chamber of the etch reactor during oxygen flush step 312 and substrate dechuck step 314 in some embodiments. In one embodiment, $O_2$ may be provided at a flow rate of between about 500 and about 1500 standard cubic centimeter per minute (sccm). In one embodiment, $O_2$ may be provided at a flow rate of between about 800 and about 1000 sccm.

Figure 4A:
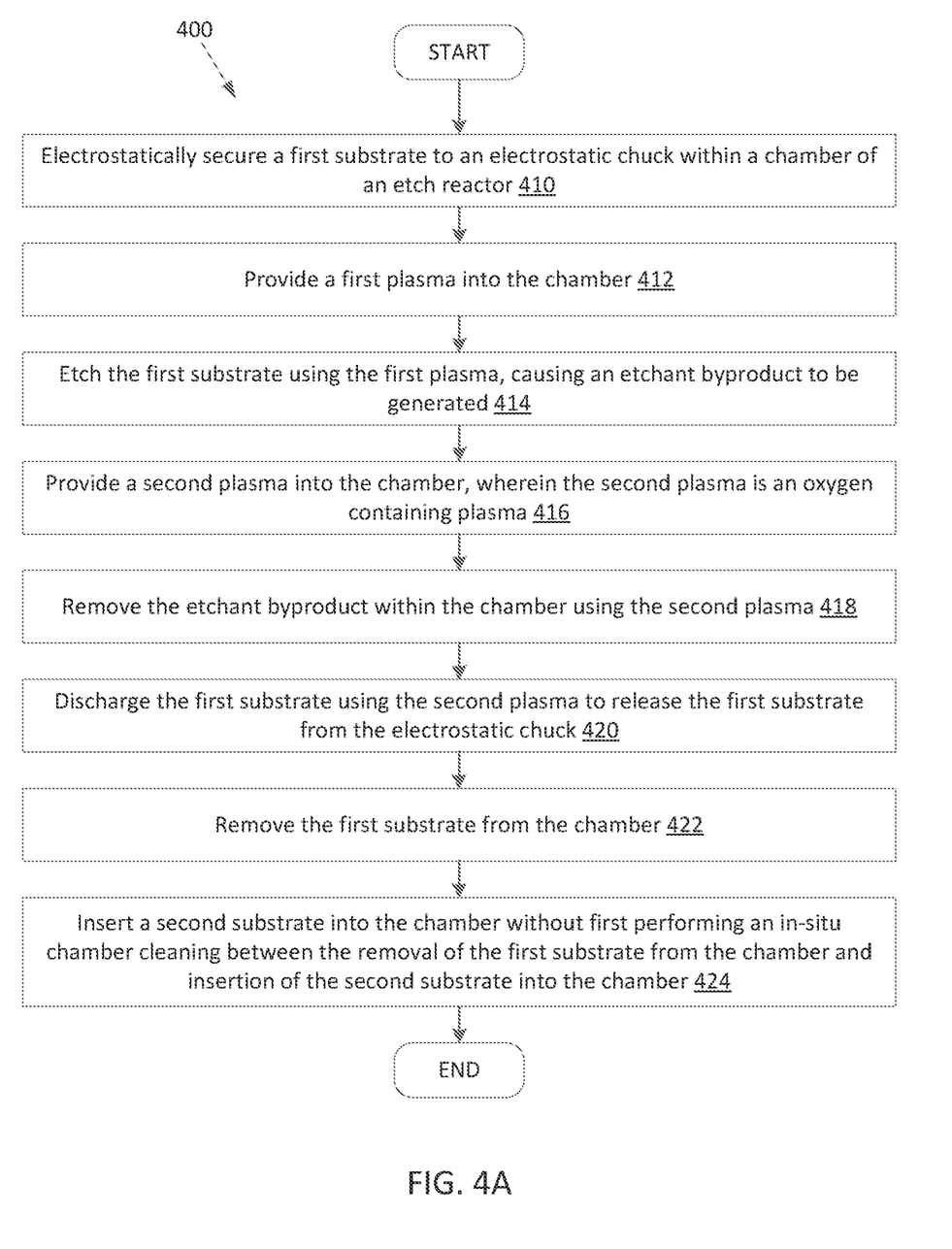
FIG. 4A illustrates a method for dechucking a substrate from an electrostatic chuck and cleaning a processing chamber, in accordance with embodiments described herein.

FIG. 4A illustrates a method 400 for dechucking a substrate from an electrostatic chuck and cleaning a processing chamber, in accordance with embodiments described herein. At block 410, a first substrate may be electrostatically secured to an ESC within an etch reactor. The ESC may contain a plurality of electrodes to provide an electrostatic force between the ESC and the first substrate. The electrostatic force may secure the first substrate to the ESC and prevent it from shifting during the etch process.

The first substrate may include one or more layers of a non-metal material. The one or more layers may be composed of an oxide material and/or a nitride material. In one embodiment, the first substrate may include a stack of a plurality of alternating oxide and nitride layers. A photoresist may be disposed on a surface of the first substrate. The photoresist may contain a detailed pattern that is to be etched on the surface of the first substrate. The photoresist pattern may differ depending on the application of the substrate (e.g., 3DNAND flash memory, 2DNAND flash memory, etc.).

At block 412, a first plasma may be provided into the chamber. The first plasma may be composed of $CH_4$, $CHF_3$, $CH_3F$, or other halogen containing plasma. The first plasma may be provided by a gas distribution component within the chamber, such as showerhead 130 illustrated in FIG. 1. At block 414, the first substrate may be etched by the first plasma. In one embodiment, one layer of the first substrate (e.g., an oxide layer or a nitride layer) may be etched by the first plasma from the surface of the first substrate. In another embodiment, all portions of the first substrate surface not covered by a photoresist may be etched by the first plasma, while all portions covered by the photoresist may not be etched.

An etchant byproduct may be generated as a result of the etching. In one embodiment, the etchant byproduct may contain carbon. This may result from the reaction of the carbon based first plasma (e.g., $CH_4$, $CHF_3$, $CH_3F$) and the layer of the substrate being etched. The etchant byproduct may be deposited on the walls and other component surfaces within the chamber of the etch reactor.

At block 416, a second plasma may be provided into the chamber. The second plasma may be an oxygen containing plasma (e.g., $O_2$, $O_3$, NO, $NO_2$, $NO_3$). At block 418, the etchant byproduct may be removed from within the chamber using the second plasma (e.g., an oxygen plasma). The oxygen plasma may soften and remove all etchant byproduct deposited on the walls and other component surfaces within the chamber of the etch reactor. The oxygen plasma may be provided for a duration of time sufficient to remove all etchant byproduct from the chamber. In one embodiment, the oxygen plasma may be provided for a duration of about 10 seconds to about 20 seconds.

At block 420, the first substrate may be discharged (e.g., have its charge removed) and dechucked from the electrostatic chuck using the second plasma. The oxygen plasma may act as a conductive path for the charge on the chucked substrate, allowing the substrate to be discharged. The second plasma may concurrently remove the etchant byproduct from the chamber and discharge the first substrate from the electrostatic chuck.

The duration of time sufficient to completely discharge the substrate not be long enough to completely remove the etchant byproduct from the chamber. In one embodiment, a first portion of the etchant byproduct is removed from the chamber using the second plasma for a first time period while the first substrate remains electrostatically secured to the ESC, referred to as an oxygen flush process. The first time period may be between about 5 seconds to about 30 seconds in some embodiments. The chucking electrodes of the ESC may then be deactivated, and the first substrate may then be discharged using the second plasma to release the first substrate from the ESC. A second portion of the etchant byproduct may be removed from the chamber using the second plasma for a second time period during discharging/dechucking. The second time period may be between about 10 seconds to about 30 seconds. By providing the second plasma for the duration of the first and second time period, the first substrate may have enough time to completely discharge and at the same time be completely cleaned, so as to be safely removed from the ESC.

At block 422, the first substrate may be removed from the chamber. At block 424, a second substrate may be inserted into the chamber without first performing an ICC between the removal of the first substrate from the chamber and insertion of the second substrate into the chamber. By discharging/dechucking the first substrate from the ESC using an oxygen plasma, the etchant byproduct may be completely removed from the chamber prior to a second substrate being introduced into the chamber. As such, the traditional ICC step may be eliminated from the overall etching process.

Figure 4B:
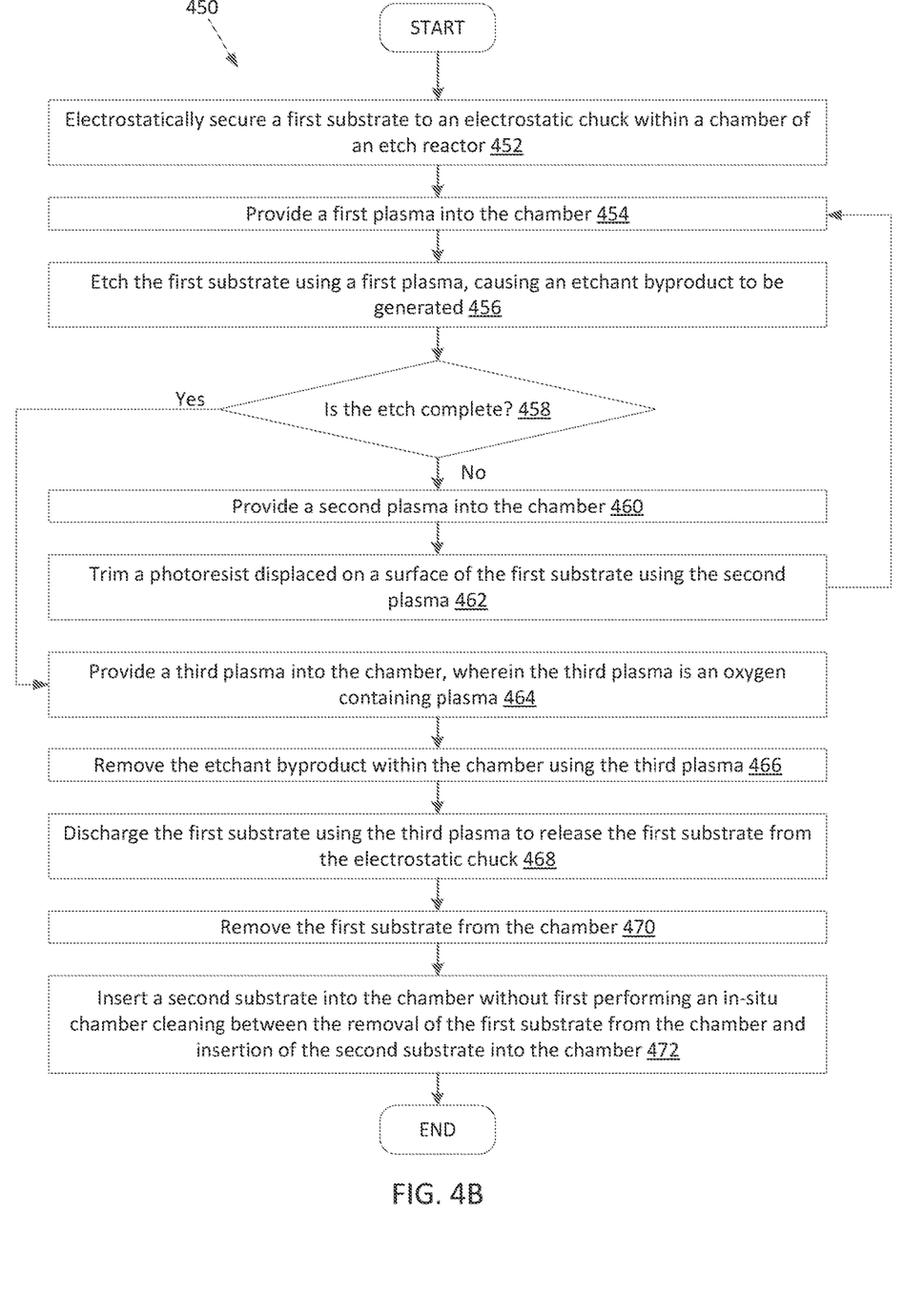
FIG. 4B illustrates a detailed method for dechucking a substrate from an electrostatic chuck and cleaning a processing chamber, in accordance with embodiments described herein.

FIG. 4B illustrates a detailed method for dechucking a substrate from an electrostatic chuck and cleaning a processing chamber, in accordance with embodiments described herein. At block 452, a first substrate may be electrostatically secured to an ESC within an etch reactor. The ESC may contain a plurality of electrodes to provide an electrostatic force between the ESC and the first substrate. The electrostatic force may secure the first substrate to the ESC and prevent it from shifting during the etch process.

At block 454, a first plasma may be provided into the chamber. The first plasma may be composed of $CH_4$, $CHF_3$, $CH_3F$, or other halogen containing plasma. The first plasma may be provided by a gas distribution component within the chamber, such as showerhead 130 illustrated in FIG. 1. At block 456, the first substrate may be etched by the first plasma. In one embodiment, one layer of the first substrate (e.g., an oxide layer or a nitride layer) may be etched by the first plasma from the surface of the first substrate. In another embodiment, all portions of the first substrate surface not covered by a photoresist may be etched by the first plasma, while all portions covered by the photoresist may not be etched.

An etchant byproduct may be generated as a result of the etching. In one embodiment, the etchant byproduct may contain carbon. This may result from the reaction of the carbon based first plasma (e.g., $CH_4$, $CHF_3$, $CH_3F$) and the layer of the substrate being etched. The etchant byproduct may be deposited on the walls and other component surfaces within the chamber of the etch reactor.

At block 458, processing logic may determine whether etching of the substrate is complete. If etching is complete, then the method may proceed to block 420. If the etching is not complete, then the method may continue to block 464.

At block 460, a second plasma may be provided into the chamber. The second plasma may be an oxygen containing plasma (e.g., $O_2$, $O_3$, NO, $NO_2$, $NO_3$). At block 462, the photoresist displaced on the surface of the first substrate may be trimmed using the second plasma. The photoresist may be trimmed so to generate a new or different pattern of the photoresist, which then may be etched onto the surface of the first substrate. The second plasma may also remove a portion of the etchant byproduct from the chamber that resulted from the etching step of block 456. In some embodiments, all of the etchant byproduct may be removed from the chamber by the second plasma. In other embodiments, the duration of the trimming process may not be sufficient to completely remove all etchant byproduct from within the chamber. As such, only a portion of the etchant byproduct may be removed by the second plasma.

The steps performed at blocks 454, 456, 458, 460, and 462 (e.g. the etching and trimming steps) may be repeated multiple times during method 450 to achieve a target structure of the first etched substrate. For example, the first substrate may be etched in a staircase pattern for use in various flash memory applications (e.g., 3DNAND). During a first iteration of the etching and trimming steps, a first plasma may etch a portion of a first layer (e.g. oxide or nitride layer) of the substrate, exposing a second layer. The photoresist displaced on the surface of the first substrate may then be trimmed by the second plasma, exposing an unetched surface of the first layer. During the second iteration of the etching and trimming steps, the exposed surface of the first layer, and the exposed second layer may be etched by the first plasma. Etching the layered first substrate using this technique may create a staircase design in the layers of the substrate. The etching and trimming steps may be repeated until the target structure of the etched first substrate is achieved. Although, in some embodiments, the second plasma may remove a portion of the etchant byproduct deposited on the surfaces of the chamber, the repeated etching steps may cause the etchant byproduct to buildup on the surfaces of the chamber, thus indicating a subsequent cleaning step, as described in more detail below.

Once the etch process for the substrate has been determined to be complete at block 458, the operations of block 464 are performed. The operations performed at blocks 464, 466, and 468 may correspond to the oxygen flush and oxygen dechuck steps illustrated in FIG. 2C. In one embodiment, the oxygen dechuck step may be a combined dechuck and ICC process that simultaneously discharges the substrate and cleans the chamber, as illustrated in FIG. 2B. At block 464, a third plasma may be provided into the chamber of the etch reactor. The third plasma may be an oxygen containing plasma. In one embodiment, the third plasma may be composed of at least one of $O_2$, $O_3$, NO, $NO_2$, $NO_3$, or a mixture thereof.

At block 466, the etchant byproduct may be removed from within the chamber using the third plasma (e.g., an oxygen plasma). The oxygen plasma may soften and remove all etchant byproduct deposited on the walls and other component surfaces within the chamber of the etch reactor. The oxygen plasma may be provided for a duration of time sufficient to remove all etchant byproduct from the chamber. In one embodiment, the oxygen plasma may be provided for a duration of about 10 seconds to about 45 seconds.

At block 468, the first substrate may be discharged (e.g., have its charge removed) and dechucked from the electrostatic chuck using the third plasma. The oxygen plasma may act as a conductive path for the charge on the chucked substrate, allowing the substrate to be discharged. The third plasma may concurrently remove the etchant byproduct from the chamber and discharge the first substrate from the electrostatic chuck.

The duration of time sufficient to discharge the substrate may not be long enough to completely remove the etchant byproduct from the chamber. Accordingly, in one embodiment, a first portion of the etchant byproduct may be removed from the chamber using the third plasma for a first time period while the first substrate remains electrostatically secured to the ESC, referred to as an oxygen flush process. The first time period may be between about 5 seconds to about 30 seconds. The chucking electrodes of the ESC may then be deactivated, and the first substrate may then be discharged using the third plasma to release the first substrate from the ESC. A second portion of the etchant byproduct may be removed from the chamber using the third plasma for a second time period during discharging/dechucking. The second time period may be between about 10 seconds to about 30 seconds. By providing the third plasma for the duration of the first and second time period, the first substrate may have enough time to completely discharge and at the same time be completely cleaned, so as to be safely removed from the ESC.

At block 470, the first substrate may be removed from the chamber. At block 472, a second substrate may be inserted into the chamber without first performing an ICC between the removal of the first substrate from the chamber and insertion of the second substrate into the chamber. By discharging/dechucking the first substrate from the ESC using an oxygen plasma, the etchant byproduct may be completely removed from the chamber prior to a second substrate being introduced into the chamber. As such, the traditional ICC step may be eliminated from the overall etching process.

Figure 5A:
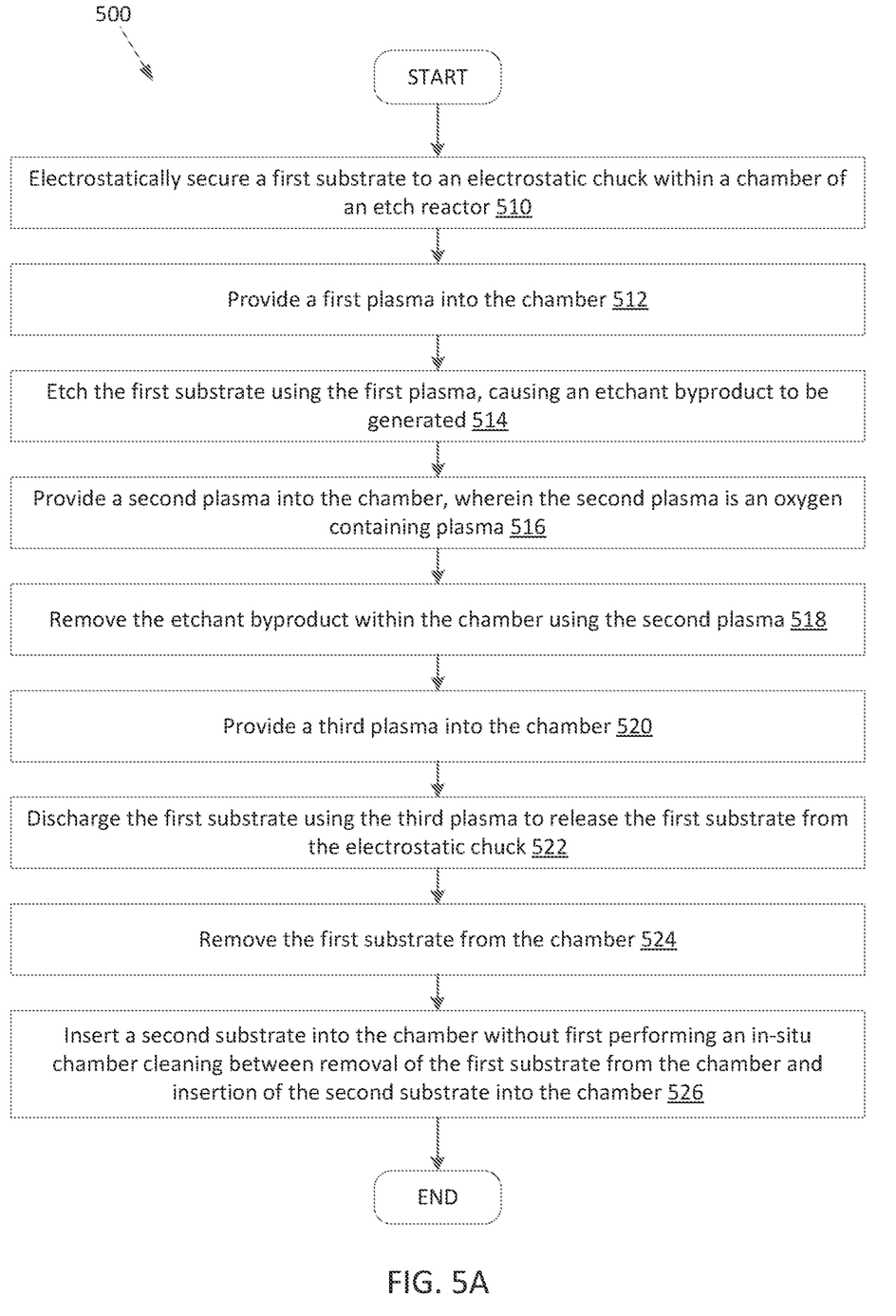
FIG. 5A illustrates another method for dechucking a substrate from an electrostatic chuck and cleaning a processing chamber, in accordance with embodiments described herein.

FIG. 5A illustrates another method 500 for dechucking a substrate from an electrostatic chuck and cleaning a processing chamber, in accordance with embodiments described herein. The steps performed at blocks 510-518 may correspond to the steps performed at blocks 410-418 of method 400 illustrated in FIG. 4A.

At block 520, a third plasma may be provided into the chamber. The third plasma may be an inert, non-oxygen containing plasma. In one embodiment, the third plasma may be composed of Ar, or any other conductive gases inert to process gases.

At block 522, the first substrate may be discharged using the third plasma to release the first substrate from the ESC. In one embodiment, the second plasma may remain in the chamber while the third plasma discharges the first substrate from the ESC. While the first substrate is discharging from the ESC, the second plasma may continue to remove the etchant byproduct from the chamber. In one embodiment, the second and the third plasma may remain in the chamber for a duration of about 10 seconds to about 30 seconds. In one embodiment, the second plasma may be removed before the third plasma is provided into the chamber to discharge the first substrate from the ESC. The second and third plasma may remain in the chamber of a duration of about 10 seconds to about 30 seconds each.

At block 524, the first substrate may be removed from the chamber. At block 526, a second substrate may be inserted into the chamber without first performing an in-situ chamber cleaning (ICC) between removal of the first substrate from the chamber and insertion of the second substrate into the chamber.

Figure 5B:
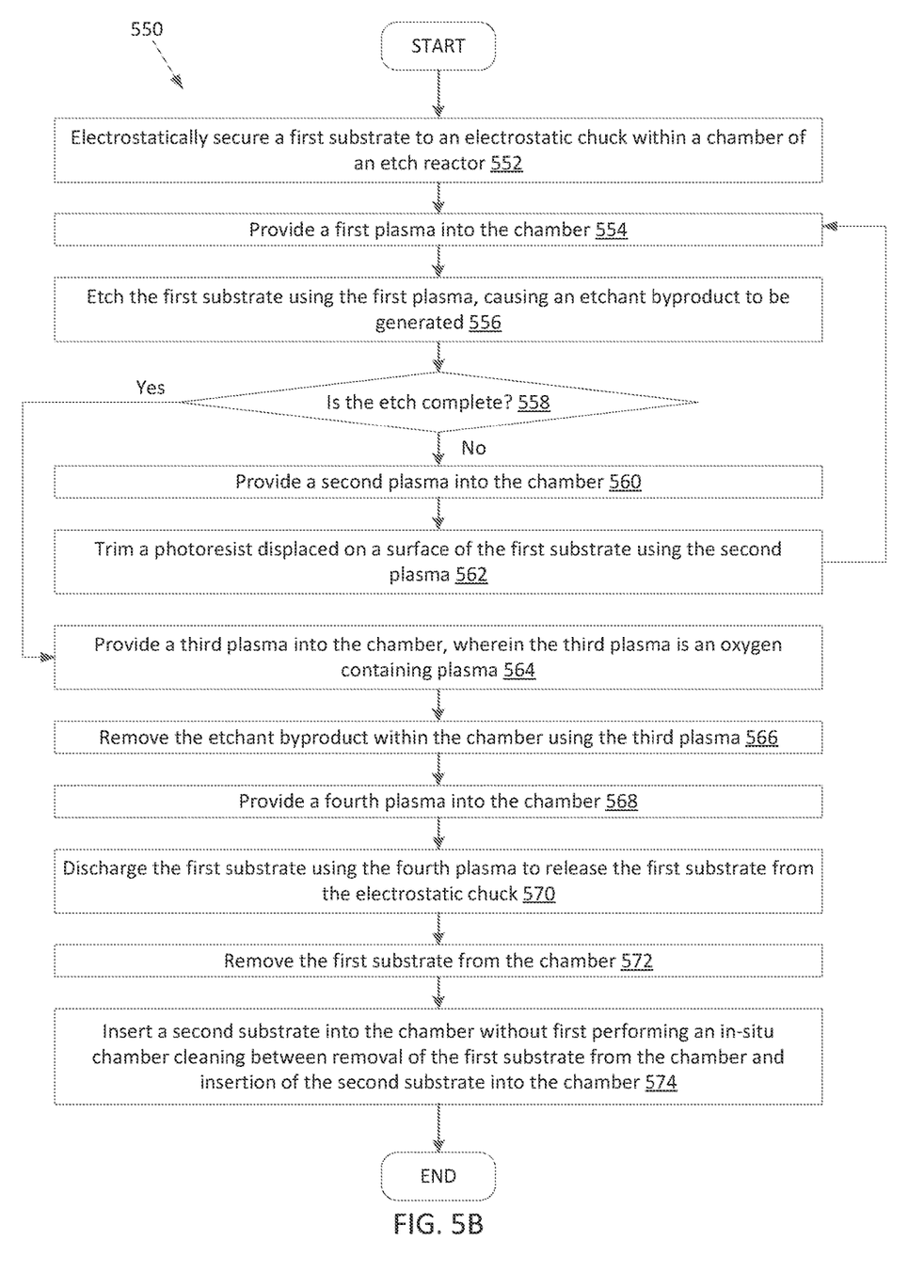
FIG. 5B illustrates another detailed method for dechucking a substrate from an electrostatic chuck and cleaning a processing chamber, in accordance with embodiments described herein.

FIG. 5B illustrates another detailed method for dechucking a substrate from an electrostatic chuck and cleaning a processing chamber, in accordance with embodiments described herein. The steps performed at blocks 552-566 may correspond to the steps performed at blocks 452-466 of method 450 illustrated in FIG. 4B.

At block 568, a fourth plasma may be provided into the chamber. The fourth plasma may be an inert, non-oxygen containing plasma. In one embodiment, the fourth plasma may be composed of Ar, or any other conductive gases inert to process gases.

At block 570, the first substrate may be discharged using the fourth plasma to release the first substrate from the ESC. In one embodiment, the oxygen plasma may remain in the chamber while the fourth plasma discharges the first substrate from the ESC. While the first substrate is discharging from the ESC, the third plasma may continue to remove the etchant byproduct from the chamber. In one embodiment, the third and the fourth plasma may remain in the chamber for a duration of about 10 seconds to about 30 seconds. In one embodiment, the third plasma may be removed before the fourth plasma is provided into the chamber to discharge the first substrate from the ESC. The third and fourth plasma may remain in the chamber of a duration of about 10 seconds to about 30 seconds each.

At block 572, the first substrate may be removed from the chamber. At block 574, a second substrate may be inserted into the chamber without first performing an in-situ chamber cleaning (ICC) between removal of the first substrate from the chamber and insertion of the second substrate into the chamber.

Various tests were conducted to compare the etching process with integrated clean and dechuck described with respect to embodiments of the present disclosure and the traditional substrate etching process sequence described with respect to FIG. 2A. By eliminating the ICC process typically performed each time after an etched wafer is removed from the chamber, overall substrate processing time decreases significantly. For example, total processing time may be reduced by approximately 10-15% in embodiments, resulting in approximately a 10-15% improvement (e.g., a 13% improvement for some processes) in throughput for an etch reactor. Also, by eliminating the traditional stand-alone ICC process, the etch rate between the process of record, the oxygen flush, and the oxygen dechuck is stabilized because the overall process is not interrupted to remove the substrate from the chamber before ICC.

As discussed above, by eliminating the ICC process, the overall process time is reduced from between about 135 to about 225 seconds to between about 75 seconds to about 150 seconds. It was also found that the oxygen-based dechuck, compared with an inert dechuck traditionally used (e.g., an Ar dechuck) resulted in better particle performance within the chamber, causing a lower number of particle adders. For example, an Ar dechuck may have about 10 particle adders having a size of at least 35 nm or more particle adders, while an oxygen-based dechuck may have less than 5 particle adders having a size of at least 35 nm.

Finally, during a marathon test experiment to simulate a production case, it was discovered that there was no difference with respect to other production variables by using an oxygen dechuck instead of an Ar dechuck. For example, a location correction factor (LCF) comparison illustrated that there was no wafer movement during the oxygen dechuck, which is expected with an Ar dechuck.

Embodiments are described with reference to a oxygen-based dechuck process that is performed at the end of an etch process. However, it should be understood that in other embodiments the described oxygen-based dechuck process can be performed at the end of other types of processes as well. This may minimize or eliminate wafer-free ICC processes performed between processes on wafers.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed as a single step.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
    etching one or more layers on a substrate electrostatically secured to an electrostatic chuck within a chamber of an etch reactor using a first plasma, wherein at least a portion of the one or more layers are covered by a photoresist having an initial pattern, and wherein the etching of the one or more layers causes an etchant byproduct to be generated and deposited on one or more surfaces of a plurality of components of the chamber;
    after the etching is complete, providing a second plasma into the chamber for a first time period that is sufficient to concurrently trim the photoresist to have a target pattern and remove a target amount of the etchant byproduct from the one or more surfaces of the plurality of components of the chamber using the second plasma, wherein the second plasma is an oxygen containing plasma;
    while the second plasma is provided into the chamber for the first time period, monitoring an optical emission corresponding to an amount of the etchant byproduct remaining in the chamber during removal of the etchant byproduct from the chamber using the second plasma;
    responsive to determining that the optical emission satisfies a criterion, deactivating one or more chucking electrodes of the electrostatic chuck;
    determining a second time period that is sufficient to electrostatically discharge the substrate using a third plasma;
    responsive to deactivating the one or more chucking electrodes of the electrostatic chuck, providing the third plasma into the chamber for the determined second time period to discharge the substrate using the third plasma to release the substrate from the electrostatic chuck, wherein the third plasma is an inert, non-oxygen containing plasma; and
    removing the substrate from the chamber.

2. The method of claim 1, wherein at least one of the one or more layers comprise a non-metal material.

3. The method of claim 1, wherein at least one of the one or more layers comprise at least one of an oxide layer or a nitride layer.

4. The method of claim 3, wherein the one or more layers comprise a stack of a plurality of alternating oxide layers and nitride layers.

5. The method of claim 1, wherein the first plasma comprises at least one of CH4, CHF3, or CH3F and the second plasma comprises at least one of 02, 03, NO, NO2, NO3, or a mixture thereof.

6. The method of claim 1, wherein the second plasma has a flow rate of between about 500 seem and about 1000 seem.

7. A system comprising:
an etch reactor comprising an electrostatic chuck in a chamber of the etch reactor; and
a system controller comprising a memory and a processor, the processor to: cause one or more layers on a substrate electrostatically secured to the
electrostatic chuck within the chamber of the etch reactor to be etched using a first plasma, wherein at least a portion of the one or more layers are covered by a photoresist having an initial pattern, and wherein the etching of the one or more layers causes an etchant byproduct to be generated and deposited on one or more surfaces of a plurality of components of the chamber;
after the etching is complete, cause a second plasma to be provided into the chamber for a first time period that is sufficient to concurrently trim the photoresist to have a target pattern and remove a target amount of the etchant byproduct from the one or more surfaces of the plurality of components of the chamber using a third plasma, wherein the second plasma is an oxygen containing plasma;
while the second plasma is provided into the chamber for the first time period, monitoring an optical emission corresponding to an amount of the etchant byproduct remaining in the chamber during removal of the etchant byproduct from the chamber using the second plasma;
responsive to determining that the optical emission satisfies a criterion, deactivate one or more chucking electrodes of the electrostatic chuck;
determine a second time period that is sufficient to electrostatically discharge the substrate using the second plasma;
responsive to deactivating the one or more chucking electrodes of the electrostatic chuck, cause the third plasma to be provided into the chamber for the determined second time period to discharge the substrate using the third plasma to release the substrate from the electrostatic chuck, wherein the third plasma is an inert, non-oxygen containing plasma; and
cause the substrate to be removed from the chamber.

8. The system of claim 7, wherein at least one of the one or more layers comprise a non-metal material.

9. The system of claim 7, wherein at least one of the one or more layers comprise at least one of an oxide layer or a nitride layer.

10. The system of claim 9, wherein the one or more layers comprise a stack of a plurality of alternating oxide layers and nitride layers.

11. The system of claim 7, wherein the first plasma comprises at least one of CH4, CHF3, or CH3F and the second plasma comprises at least one of 02, 03, NO, NO2, NO3, or a mixture thereof.

12. The system of claim 7, wherein the second plasma has a flow rate of between about 500 seem and about 1000 seem.

13. A system controller comprising: a memory; and
a processor coupled to the memory, the processor to:
cause one or more layers on a substrate electrostatically secured to an electrostatic chuck within a chamber of an etch reactor to be etched using a first plasma, wherein at least a portion of the one or more layers are covered by a photoresist having an initial pattern, and wherein the etching of the one or more layers causes an etchant byproduct to be generated and deposited on one or more surfaces of a plurality of components of the chamber;
after the etching is complete, cause a second plasma to be provided into the chamber for a first time period that is sufficient to concurrently trim the photoresist to have a target pattern and remove a target amount of the etchant byproduct from the one or more surfaces of the plurality of components of the chamber using the second plasma, wherein the second plasma is an oxygen containing plasma;
while the second plasma is provided into the chamber for the first time period, monitoring an optical emission corresponding to an amount of the etchant byproduct remaining in the chamber during removal of the etchant byproduct from the chamber using the second plasma;
responsive to determining that the optical emission satisfies a criterion, deactivate one or more chucking electrodes of the electrostatic chuck;
determine a second time period that is sufficient to electrostatically discharge the substrate using a third plasma;
responsive to deactivating the one or more chucking electrodes of the electrostatic chuck, cause the third plasma to be provided into the chamber for the determined second time period to discharge the substrate using the third plasma to release the substrate from the electrostatic chuck, wherein the third plasma is an inert, non-oxygen containing plasma; and
cause the substrate to be removed from the chamber.

14. The system controller of claim 13, wherein at least one of the one or more layers comprise a non-metal material.

15. The system controller of claim 13, wherein at least one of the one or more layers comprise at least one of an oxide layer or a nitride layer.

16. The system controller of claim 15, wherein the one or more layers comprise a stack of a plurality of alternating oxide layers and nitride layers.

17. The system controller of claim 13, wherein the first plasma comprises at least one of CH4, CHF3, or CH3F and the second plasma comprises at least one of 02, 03, NO, NO2, NO3, or a mixture thereof.

18. The system controller of claim 13, wherein the second plasma has a flow rate of between about 500 seem and about 1000 seem.

* * * * *